United States Patent
Roethlingshoefer et al.

(10) Patent No.: US 6,790,478 B1
(45) Date of Patent: Sep. 14, 2004

(54) METHOD FOR SELECTIVELY COATING CERAMIC SURFACES

(75) Inventors: Walter Roethlingshoefer, Reutlingen (DE); Manfred Boehm, Grafenau (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/030,779

(22) PCT Filed: Jun. 21, 2000

(86) PCT No.: PCT/DE00/02023
§ 371 (c)(1),
(2), (4) Date: May 24, 2002

(87) PCT Pub. No.: WO01/03174
PCT Pub. Date: Jan. 11, 2001

(30) Foreign Application Priority Data

Jul. 3, 1999 (DE) .......................... 199 30 782

(51) Int. Cl.[7] ................................. B05D 1/36
(52) U.S. Cl. ....................... 427/348; 427/352; 427/355; 427/387; 427/407.1; 427/409
(58) Field of Search ................... 427/387, 409, 427/407.1, 348, 352, 355

(56) References Cited

U.S. PATENT DOCUMENTS

| | | | | |
|---|---|---|---|---|
| 5,213,864 A | * | 5/1993 | Wong | 428/76 |
| 5,380,555 A | * | 1/1995 | Mine et al. | 427/226 |
| 5,380,567 A | * | 1/1995 | Haluska | 427/578 |
| 5,707,683 A | * | 1/1998 | Currie et al. | 427/126.2 |
| 5,906,859 A | | 5/1999 | Bremmer et al. | |

FOREIGN PATENT DOCUMENTS

| | | | |
|---|---|---|---|
| EP | 0 011 738 | | 6/1980 |
| EP | 0 270 241 | | 6/1988 |
| EP | 590781 | * | 4/1994 |
| EP | 908499 | * | 4/1999 |

OTHER PUBLICATIONS

White, Proceedings of the IEEE, 57(9), pp 1610–1615, 1069.*
Takamura et al, Japanese Journal of Polymer Science and Technology, 57(4), pp 198–207, 2000.*

* cited by examiner

Primary Examiner—Erma Cameron
(74) Attorney, Agent, or Firm—Kenyon & Kenyon

(57) ABSTRACT

In a ceramic hybrid substrate and a method for treating the surface of a ceramic hybrid substrate having ceramic surface areas and metallic surface areas, the ceramic surface areas are esterified.

17 Claims, 1 Drawing Sheet

METHOD FOR SELECTIVELY COATING CERAMIC SURFACES

FIELD OF THE INVENTION

The present invention relates to a method for treating the surface of a ceramic hybrid substrate including ceramic surface areas and metallic surface areas.

BACKGROUND INFORMATION

The use of ceramic (glass ceramic) hybrid substrates is conventional, for example, in the construction of electrical circuit arrangements. Such electrical circuit arrangements are used in various industrial areas, for example, in the area of motor vehicle electronics for engine control, anti-lock braking control, etc. The ceramic hybrid substrates contain processed electronic components and metallic conducting tracks, via which contacting of the hybrid substrates can occur. It is conventional that such ceramic hybrid substrates are obtainable by laminating individual function layers that may have electrical connecting leads, integrated circuit constituents, micromechanical structures, etc. Such a sandwich arrangement that includes several function layers is subsequently sintered so that the finished ceramic hybrid substrate is formed. The finished ceramic hybrid substrate therefore has a surface structure that includes some ceramic surface areas and some metallic surface areas (conducting tracks, pads) embedded in them. By miniaturizing such ceramic hybrid substrates, the distance between adjacent metallic areas can be in the range of <100 $\mu$m. In order to be able subsequently to contact such metallic surface areas integrated in the so-called fine line technology, for example, by bonding, the application of electrically conductive adhesives, etc., it is conventional that the metallic surface areas can be finished, for example, by applying a contact metal (silver, gold, or the like) to the metallic surface areas using a chemical deposition process. In this case, the ceramic hybrid substrates are treated in chemical baths, some of which contain aggressive and etching substances that attack the surface of the ceramic surface areas. Moreover, it is disadvantageous that, during the deposition of the contact metal in chemical baths, deposits of metals can also occur on the ceramic surface areas which can—in particular in view of the small distances between the metallic surface areas—result in short circuits. Moreover, it is disadvantageous that during a subsequent contacting of the metallic surface areas, for example, by an electrically conductive adhesive, the adhesive tends to flow (bleed), so that short circuits can occur between adjacent metallic areas.

SUMMARY

In contrast, the method according to the present invention and the ceramic hybrid substrate according to the present invention provides the advantage that a subsequent machining of the metallic surface areas or a subsequent contacting of the metallic surface areas may occur, with a reduced tendency of short circuits between adjacent metallic surface areas. By esterifying the ceramic surface areas of the ceramic hybrid substrate, the ceramic surface areas may be protected selectively during the subsequent post—treatments in chemical baths. As a result of the esterification, a monomolecular surface layer is formed on the ceramic surface areas which is resistant to chemicals and heat, so that metal coatings chemically deposited in particular on the metallic surface areas are not able to deposit on the ceramic surface areas. Moreover, this selective esterifying of the ceramic surface areas causes a change in their surface tension, so that electrically conductive adhesives applied to the metallic surface areas do not tend to flow onto the ceramic surface areas.

The surface of the ceramic hybrid substrate may be treated with a solution including organic constituents tailored to the ceramic surface. This treatment may occur via a dipping bath, flow wave soldering, spraying on, spreading on with a doctor, etc. By wetting the surface with the solution including the organic constituents, the solution is deposited in micropores of the ceramic surface areas. Via a subsequent heat treatment, crosslinking of the organic constituents of the solution with lattice structures on the ceramic surface areas may occur. This results in the formation of the chemically and thermally stable (resistant) surface coating of the ceramic surface areas. By a subsequent removal of non-crosslinked residues of the solution including the organic constituents, the solution may be removed from the metallic surface areas, where no adhering effect (crosslinking) occurs. The metallic surface areas in the processed form and with the original properties are thus available for further processing.

An example method according to the present invention may be used for ceramic hybrid substrates whose manufacture is silicon-based, in which the ceramic surface areas are treated with silicon as a solution containing an organic component (siloxane). The concentrations of organic silicon compounds may be between 0.1 and 1% of the solution—relative to the total volume. Using such a treatment, a silicon oxide or silicon dioxide surface layer that has good resistance to chemical and thermal influences may be achieved after the crosslinking of the solution with the ceramic surface areas.

DETAILED DESCRIPTION

Figure 1:
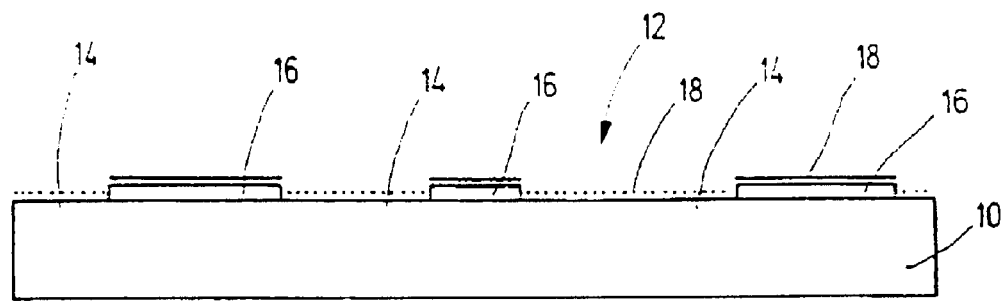
FIGS. 1 to 3 illustrate various phases of the treatment of the ceramic surface areas.
Figure 2:
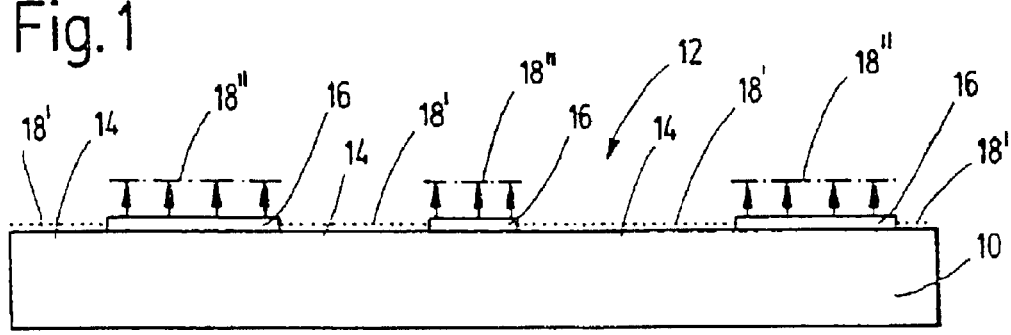
Figure 3:
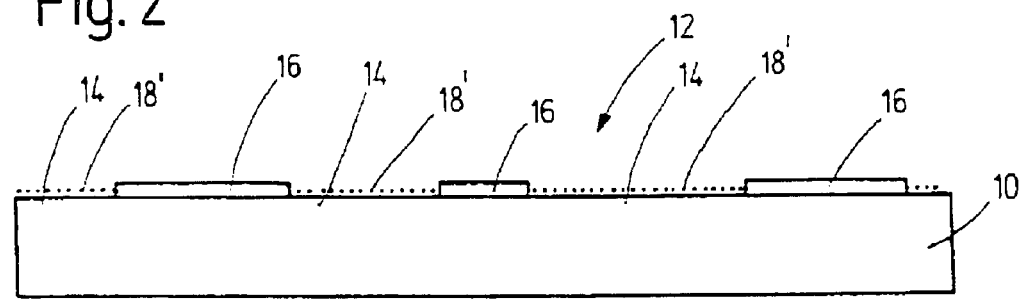

In FIGS. 1 to 3, a ceramic hybrid substrate 10 (LTCC microhybrid substrate) is illustrated schematically. Ceramic hybrid substrate 10 includes,ceramic surface areas 14 and metallic surface areas 16 on its surface 12. Metallic surface areas 16 may, for example, be bonding pads, adhesive pads, etc. The processing of such ceramic hybrid substrates 10 is generally conventional, so that further details of this will not be further explained.

An example method according to the present invention for achieving a surface improvement of ceramic surface areas 14 is explained below.

First, as illustrated in FIG. 1, surface 12 is acted upon by a solution 18 having organic components. Solution 18 may act, for example, via a dipping bath, spraying on, flow wave soldering, etc. This results in solution 18 being deposited on ceramic surface areas 14 and metallic surface areas 16. Excess quantities of solvent are removed mechanically, for example, by wiping off, blowing off, centrifuging, etc. This results in the formation of a thin layer of solution 18 on the entire surface 12, i.e., on ceramic surface areas 14 and metallic surface areas 16. Solution 18 adheres to surface 12 by surface tension and penetrates surface pores.

Solution 18 includes, for example, a 0.1% siloxane solution.

Figures 4, 5:
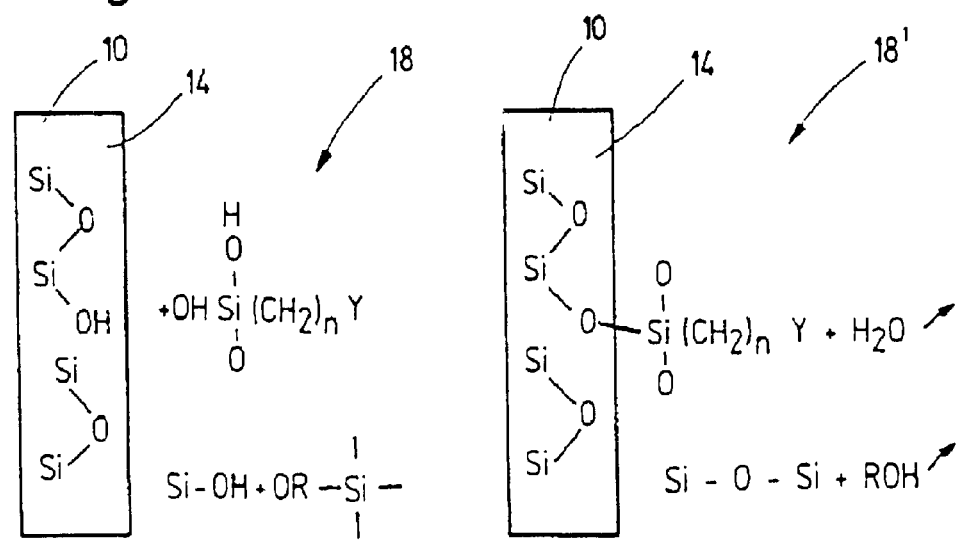
FIGS. 4 and 5 schematically illustrate the esterification of the ceramic surface areas.

FIG. 4 shows a ceramic surface area 14 of ceramic hybrid substrate 10 in section. Ceramic hybrid substrate 10 is made, for example, of a silicon glass ceramic. Such silicon glass ceramics have reactive groups (OH groups). Wetting with solution 18, which may contain silanes as organic components, is also illustrated in FIG. 4.

Subsequently, a heat treatment of ceramic hybrid substrate 10 occurs, for example, at a temperature of about 100°

C. and for a period of about 30 minutes. This results in a silanization (esterification) of ceramic surface areas 14. The resulting crosslinking is illustrated in FIG. 5. Silicon attaches itself to the reactive groups, forming an Si—O—Si structure. Such silicon structures, as is conventional, excel by their chemically and thermally stable properties. Free hydroxyl groups (OH groups) as reactive groups react with the silicon-containing aduct, resulting in the formation of the Si—O—Si bond (siloxanes).

Then, as illustrated in FIG. 2, residual quantities 18" of solution 18 not crosslinked with ceramic surface areas 14 are removed.

This removal may be implemented by washing off with a solvent, for example, isopropanol. This results in the surface coating of ceramic surface areas 14 with silicon components 18', as illustrated in FIG. 3. Metallic surface areas 16 do not react with the organic components, so that they are unchanged after residual quantities 18" have been detached chemically and mechanically.

Thermal decomposition of organic component $R_3$ may occur via a subsequent baking procedure, so that a silicon dioxide layer is formed in ceramic surface areas 14, as indicated in the lower structural representation in FIG. 5.

As a result of the method according to the present invention, ceramic hybrid substrate 10 includes ceramic surface areas 14 that have a high chemical stability against etching attacks occurring in the subsequent manufacturing process. In particular, defective depositions on ceramic surface areas 14 situated between metallic surface areas 16 may be avoided with a subsequent deposition of metals, for example, silver, nickel, palladium, gold, etc., on metallic surface areas 16. Thus the danger of short circuits is reduced. Moreover, the surface tension of ceramic surface areas 14 is changed, such that electrically conductive adhesives applied to metallic surface areas 16 do not tend to flow, so that the formation of bridges, etc. between adjacent metallic surface areas 16 is likewise considerably reduced.

A modification of ceramic surface areas 14 provided according to the present invention may be integrated into the total manufacturing process of the circuit arrangement including ceramic hybrid substrates 10, to produce various process advances. According to a first example embodiment variant, silanization of ceramic surface areas 14 occurs after the manufacture of ceramic hybrid substrate 10, as illustrated in FIGS. 1 to 3, i.e., before subsequent thick-film processes, baking processes, plating processes, provision of substrate 10 with conductive adhesives, bonding, etc. In particular, a protective coating of ceramic surface areas 14 against chemical attacks in the chemical baths during plating (deposition of metals on metallic surface areas 16) is achieved.

According to another variant example embodiment according to the present invention, the silanization of ceramic surface areas 14 may occur after the thick-film processes and baking processes. Silanization may then occur before plating, conductive adhesive processes, or bonding. This results in the same advantages as in the first example embodiment variant.

Silanization of ceramic surface areas 14 may also occur after plating (metallization) of metallic surface areas 14. However, this does not provide a protective coating against the action of the chemical baths on ceramic surface areas 14. However, during a subsequent provision of substrates 10 with electrically conductive adhesives or bonding, for example, the flow of the adhesives is reduced by influencing the surface tension.

Depending on the desired processing, siloxanization of ceramic surface areas 14 may thus be incorporated at various points in time during processing.

What is claimed is:

1. A method for treating a surface of a ceramic hybrid substrate including ceramic surface areas and metallic surface areas, comprising the steps of
   (a) esterifying the ceramic surface areas of the ceramic hybrid substrate;
   (b) chemically depositing metal coatings on the metallic surface areas, the esterifying of the ceramic surface areas preventing deposition of the metal coating on the ceramic surface areas.

2. The method according to claim 1, wherein the step of esterifying includes treating the ceramic surface areas with a solution including organic constituents tailored to the ceramic hybrid substrate.

3. The method according to claim 2, wherein the ceramic hybrid substrate is manufactured on the basis of silicon and the solution includes silicon.

4. The method according to claim 2, wherein the solution includes a siloxane solution.

5. The method according to claim 4, wherein the solution includes between 0.1 and 1% of siloxane and between 99 and 99.9% of isopropanol, relative to 100% total volume.

6. The method according to claim 2, wherein the treating step includes the substep of applying the solution by dip coating.

7. The method according to claim 2, wherein the treating step includes the substep of applying the solution by spraying.

8. The method according to claim 2, further comprising the step of removing excess solution mechanically.

9. The method according to claim 8, wherein the removing step includes the substep of wiping off the excess solution.

10. The method according to claim 8, wherein the removing step includes the substep of blowing off the excess solution.

11. The method according to claim 2, further comprising the step of heat-treating surface areas contacted by the solution in the treating step.

12. The method according to claim 11, wherein the surface is heat-treated in the heat-treating step at a temperature of approximately 100° C.

13. The method according to claim 11, wherein the heat-treating step is performed for a period of between 0.4 and 0.6 hours.

14. The method according to claim 11, wherein solution constituents not crosslinked remain after the esterifying step and further comprising the step of removing said solution constituents not crosslinked after the heat-treating step.

15. The method according to claim 14, wherein the removing step includes the substep of washing off the solution constituents not crosslinked.

16. The method according to claim 11, further comprising the step of removing solution constituents from the metallic surface areas after the heat-treating step.

17. A method for treating a surface of a ceramic hybrid substrate including ceramic surface areas and metallic surface areas, comprising the steps of:
   siloxanizating the ceramic surface areas;
   depositing a metal coating on the metallic surface areas, the siloxanizating of the ceramic surface areas preventing deposition of the metal coating on the ceramic surface areas.

* * * * *